United States Patent
Nihei et al.

(10) Patent No.: US 6,822,307 B2
(45) Date of Patent: Nov. 23, 2004

(54) SEMICONDUCTOR TRIODE DEVICE HAVING A COMPOUND-SEMICONDUCTOR CHANNEL LAYER

(75) Inventors: Mizuhisa Nihei, Kawasaki (JP); Yuu Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/746,064

(22) Filed: Dec. 26, 2000

(65) Prior Publication Data

US 2002/0163012 A1 Nov. 7, 2002

(30) Foreign Application Priority Data

Mar. 30, 2000 (JP) ........................................ 2000-095895

(51) Int. Cl.⁷ ...................... H01L 31/072; H01L 27/095; H01L 23/48
(52) U.S. Cl. ...................... 257/473; 257/192; 257/194; 257/472; 257/745; 257/751; 257/763; 257/768; 257/769; 257/770
(58) Field of Search ................................. 257/192, 194, 257/472, 473, 744, 745, 751, 768–770, 30

(56) References Cited

U.S. PATENT DOCUMENTS

| | | | | |
|---|---|---|---|---|
| 4,843,450 A | * | 6/1989 | Kirchner et al. | 357/52 |
| 5,214,003 A | * | 5/1993 | Shimakura et al. | 437/243 |
| 5,326,717 A | * | 7/1994 | Imaizumi et al. | 437/105 |
| 5,812,442 A | * | 9/1998 | Yoo | 365/145 |
| 6,043,514 A | * | 3/2000 | Teraguchi | 257/94 |
| 6,294,820 B1 | * | 9/2001 | Lucas et al. | 257/412 |
| 6,717,271 B2 | * | 4/2004 | Makiyama et al. | 257/773 |
| 2004/0152289 A1 | * | 8/2004 | Makiyama et al. | 438/585 |

FOREIGN PATENT DOCUMENTS

JP          4-69974          3/1992

OTHER PUBLICATIONS

Rosciszewski et al., "Ground–State Properties of Rutile: Electron–Correlation Effects", The American Physical Society, Physical Review B, vol. 57, No. 23, Jun. 15, 1998, pp. 14 667–14 672.

Zhang et al., "Characterization of Ca Impurity Segregation on the TiO2 (110) Surface", Surface Science 412/412 (1998) 242–251.

* cited by examiner

Primary Examiner—Bradley Baumeister
(74) Attorney, Agent, or Firm—Westerman, Hattori, Daniels & Adrian, LLP

(57) ABSTRACT

A semiconductor triode comprises a gate electrode provided on a channel layer, wherein there is interposed an insulating metal oxide layer between a top surface of the channel layer and the gate electrode.

11 Claims, 9 Drawing Sheets

SEMICONDUCTOR TRIODE DEVICE HAVING A COMPOUND-SEMICONDUCTOR CHANNEL LAYER

CROSS-REFERENCE TO RELATED APPLICATION

The present application is based on Japanese priority application No. 2000-095895 filed on Mar. 30, 2000, the entire contents of which are hereby incorporated by reference.

BACKGROUND OF THE INVENTION

The present invention generally relates to semiconductor devices and more particularly to a high-speed semiconductor triode having a compound-semiconductor channel layer.

Compound-semiconductor triodes, typical examples being a MESFET or a HEMT, is characterized by high operational speed due to high electron mobility of compound-semiconductor material used for the active layer thereof. Thus, such compound-semiconductor triodes are used extensively for high-frequency or ultra high-frequency applications including GHz band application.

In such compound-semiconductor triodes, too, there holds the scaling law, and efforts are made to reduce the gate length as much as possible for maximizing the operational speed.

A high-speed semiconductor triode having a short gate length is designed, in order to suppress the short-channel effect as much as possible, such that carriers are transported through a shallow, limited surface region of a compound-semiconductor layer used for the active layer of the semiconductor triode.

Thus, the quality of the crystal of the compound-semiconductor layer, particularly the quality of the surface part of the compound-semiconductor layer used for the active layer is extremely important for the operational characteristic of the semiconductor triode.

FIG. 1 shows the construction of a HEMT 10 according to a related art.

Referring to FIG. 1, the HEMT 10 is constructed on a semi-insulating InP substrate 11 and includes a channel layer 12 of undoped InGaAs formed epitaxially on the InP substrate 11 and an electron-supplying layer 13 of n-type InAlAs formed also epitaxially on the channel layer 12. A cap layer 14 of n$^+$-type InGaAs is formed on the electron-supplying layer 13 epitaxially, and an opening 14A exposing the surface of the electron-supplying layer 13 is formed in the cap layer 14. Further, a gate electrode 15 Is formed on the exposed surface of the electron-supplying layer 13 in the opening 14A.

In the illustrated example, the gate electrode 15 is a so-called mushroom type or T-type electrode and includes a Ti layer 15A making a Schottky contact with the exposed electron-supplying layer 13, a Pt diffusion-barrier layer 15B formed on the Ti layer 15A, and a low-resistance Au electrode layer 15C having the mushroom-shape and formed on the Pt layer 15B.

By using the Au electrode 15C with such a mushroom-shape, it becomes possible to reduce the resistance of the gate electrode 15 while minimizing the gate-length of the gate electrode 15 simultaneously. The Pt diffusion barrier layer 15B, on the other hand, blocks the diffusion of Au atoms from the Au electrode into the electron-supplying layer 13. Further, the Ti layer 15A provided between the electron-supplying layer 13 and the Pt layer 15B improves the adherence of the Pt layer 15B to the electron-supplying layer 13.

In the HEMT 10 of FIG. 1, it should further be noted that ohmic electrodes 16 and 17 are formed on the InGaAs cap layer 14 in correspondence to contact regions 14B and 14C respectively. The ohmic electrode 16 constitutes a non-alloy ohmic electrode and includes a Ti layer 16A forming an ohmic contact with the n$^+$-type cap layer 14, a Pt diffusion barrier layer 16B formed on the Ti layer 16A and a low-resistance Au electrode layer 16C formed on the Pt diffusion barrier layer 16B. The ohmic electrode 17 has a similar construction.

Further, the HEMT of FIG. 1 includes an SiN passivation film 18 covering the exposed part of the electron-supplying layer 13 and the contact regions 14B and 14C.

In such a conventional compound-semiconductor triodes, including also MESFETs in addition to HEMTs, the gate electrode 15 makes a direct contact with the semiconductor layer, and thus, there is a substantial risk that Ti atoms may cause a diffusion from the Ti adhesion layer 15A of the gate electrode 15 into the n-type electron-supplying layer 13 and further into the channel layer 12 underneath the electron-supplying layer 13. When such a diffusion of Ti is caused in the semiconductor layers constituting the channel of the triode, the threshold characteristic of the device is deteriorated seriously.

FIG. 2 shows such a change of the threshold voltage Vth for the case such a diffusion of Ti is caused from a gate electrode into a channel layer in the case of a conventional MESFET.

Referring to FIG. 2, it can be seen that the threshold voltage Vth increases generally linearly with the depth of penetration of the Ti atoms, and that the threshold voltage Vth changes as much as 0.1V with the penetration of only 1 nm in depth. Thus, there is a need for a structure, in compound-semiconductor triodes such as HEMTs or MESFETs, which is effective for suppressing the diffusion of TI atoms from the electrode into the compound-semiconductor layer.

Conventionally, it has been practiced in the art of compound-semiconductor Schottky diode to interpose a metal oxide layer between the Schottky electrode and the compound-semiconductor layer for suppressing the diffusion of metal elements from the Schottky electrode to the compound-semiconductor layer, and hence to suppress the change of Schottky barrier height. In relation to this, reference may be made to Japanese Laid-Open Patent Publication 4-69974.

In this prior art reference, the use of TiOx formed as a result of oxidation of the surface of the metallic Ti layer is described as an example of such a metal oxide layer.

FIG. 3 shows the effect of Ti diffusion on the Schottky barrier height $\phi_B$ of a Schottky diode.

Referring to FIG. 3, it can be seen that there occurs no substantial change of Schottky barrier height $\phi_B$ even when the Ti atoms have penetrated into the semiconductor layer with the thickness of several nanometers. Thus, it is concluded that, in the case of a semiconductor Schottky diode, the use of such a metal oxide layer between the semiconductor layer and the Schottky electrode causes no substantial change of diode characteristic.

In the case of a compound-semiconductor triodes such as a HEMT or a MESFET, on the other hand, the situation is different, and penetration Ti of only 1 nm depth in the channel region causes a serious change of the threshold voltage Vth.

In the fabrication process of a semiconductor triode, various annealing steps are applied after a Schottky electrode is formed on a channel layer as a gate electrode. Thus, the foregoing variation of the threshold voltage Vth, caused as a result of Ti penetration, remains a substantial problem in the art of compound-semiconductor triodes.

SUMMARY OF THE INVENTION

Accordingly, it is a general object of the present invention to provide a novel and useful compound-semiconductor triode wherein the foregoing problems are eliminated.

Another and more specific object of the present invention is to provide a high-speed compound-semiconductor triode stable against thermal annealing process.

Another object of the preset invention is to provide a semiconductor triode, comprising:

a semiconductor layer including a channel layer;

a first ohmic electrode supplying carriers into said channel layer;

a second ohmic electrode collecting carriers from said channel layer; and a gate electrode controlling a flow of said carriers through said channel layer from said first ohmic electrode to said second ohmic electrode, said gate electrode including an insulating metal oxide film formed at an interface to a surface of said semiconductor layer.

According to the present invention, the threshold characteristic of the semiconductor triode is stabilized substantially by interposing the metal oxide film. Further, such a structure is advantageous for improving the yield of production of the device.

Preferably, the metal oxide film is formed of any of an oxide of a metal element selected from the group consisting of Ti, Co, Ni, Ta, Pr, Hf, Zr and Pd. The metal oxide film may be formed also at the interface between the first ohmic electrode and the semiconductor layer and the interface between the second ohmic electrode and the semiconductor layer. Preferably, the metal oxide film has a thickness allowing carrier tunneling therethrough. The metal oxide film may be provided so as to cover the surface of the semiconductor layer continuously from the first ohmic electrode to the gate electrode and from the gate electrode to the second ohmic electrode. The semiconductor triode of the present invention includes a HEMT and a MESFET.

Other objects and further features of the present invention will become apparent from the following detailed description when read in conjunction with the attached drawings.

DETAILED DESCRIPTION OF THE INVENTION

[First Embodiment]

Figure 4:
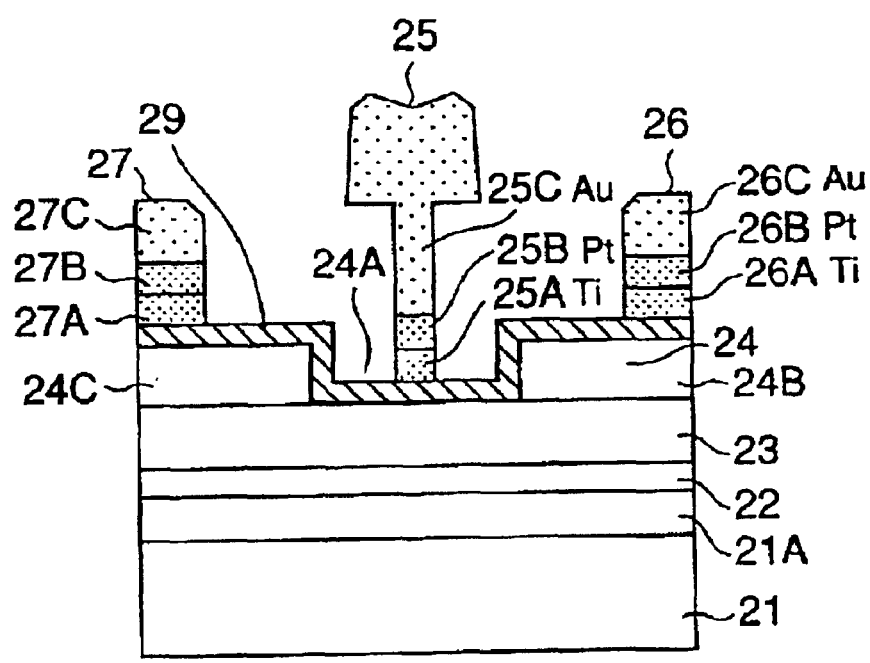
FIG. 4 is a diagram showing the construction of a HEMT according to a first embodiment of the present invention.

FIG. 4 shows the construction of a HEMT 20 according to a first embodiment of the present invention.

Referring to FIG. 4, the HEMT 20 is constructed on a semi-insulating InP substrate 21 carrying thereon a buffer layer 21A of undoped InAlAs with a thickness of about 200 nm, and includes a channel layer 22 of undoped InGaAs formed on the buffer layer 21A epitaxially with a thickness of about 25 nm and an electron supplying layer 23 of n-type InAlAs formed on the channel layer 22 with a carrier density of about $2 \times 10^{18}$ cm$^{-3}$ and a thickness of about 25 nm, wherein the electron supplying layer 23 is covered with a cap layer 24 of InGaAs having a thickness of about 50 nm and a carrier density of about $1 \times 10^{19}$ cm$^{-3}$. Further, the cap layer 24 is formed with an opening 24A exposing the electron-supplying layer 23 in correspondence to a gate electrode 25.

It should be noted that the gate electrode 25 is a so-called mushroom type or T-type electrode and includes a Ti layer 25A having a thickness of about 1 nm provided in contact with the exposed surface of the electron-supplying layer in the opening 24A, a Pt barrier layer 25B formed on the Ti layer 25A with a thickness of about 10 nm, and a low-resistance Au electrode layer 25C formed on the Pt layer 25B with a thickness of about 200 nm, wherein the Au electrode layer 25C constitutes the expanded top part of the mushroom structure. Further, the HEMT 20 of FIG. 4 includes a TiO$_2$ film 29 formed between the gate electrode 25 and the electron-supplying layer with a thickness of about 4 nm.

By providing the low-resistance Au electrode layer 25C for the expanded top part of the mushroom electrode 25, it becomes possible to minimize the gate length of the electrode 25 and simultaneously the gate resistance. Further, the Pt barrier layer 25B blocks the diffusion of Au atoms from the electrode layer 25C into the electron-supplying layer 23. The Ti layer 25A and the TiO$_2$ film 29 improve the adherence between the electron-supplying layer 23 and the Pt layer 25B, and hence the adherence of the gate electrode 25 to the electron-supplying layer 23.

In the HEMT 20 of FIG. 4, it should be noted that the TiO$_2$ film 29 extends laterally and covers contact regions 24B and 24C of the InGaAs cap layer 29 continuously, wherein the contact regions 24B and 24C are the separated regions of the InGaAs cap layer 29 by the opening 24A.

Further, it can be seen that ohmic electrodes 26 and 27 are formed on the TiO$_2$ film 29 respectively in correspondence to the contact regions 24B and 24C, wherein the ohmic electrode includes a Ti layer 26A having a thickness of about 1 nm provided in ohmic contact with the n$^+$-type InGaAs cap layer 24 via the TiO$_2$ film 29, and a Pt diffusion barrier layer 26B and a low-resistance Au layer 26C having a thickness of about 200 nm reformed consecutively on the Ti layer 26A. Thereby, the layers 26A–26C form a non-alloy ohmic electrode. The ohmic electrode 27 has a similar construction.

FIGS. 5A–5E show the fabrication process of the HEMT 20 of FIG. 4.

Figure 5A:
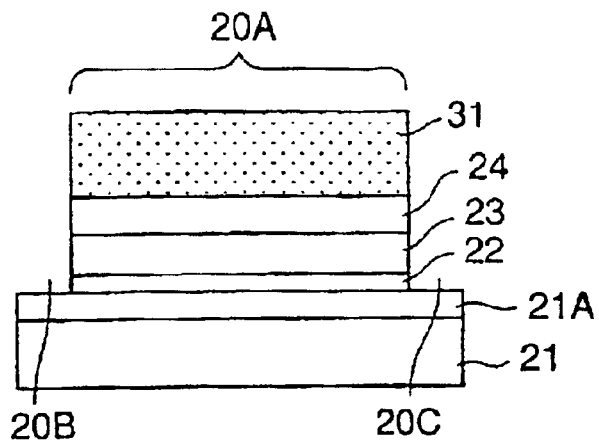
FIGS. 5A–5E are diagrams showing the fabrication process of the HEMT of FIG. 4.

Referring to FIG. 5A, a non-doped InGaAs layer, an n-type InAsAs layer and an n+-type InGaAs layer are formed consecutively on the buffer layer 21 covering the InP substrate 21 respectively in correspondence to the channel layer 22, the electron-supplying layer 23 and the cap layer 24, with respective thicknesses of 25 nm, 25 nm and 50 nm. Further, the layered semiconductor structure thus obtained is subjected to a patterning process while using a resist pattern 31, and a device region 20A is formed by forming device isolation grooves 20B and 20C.

Figure 5B:
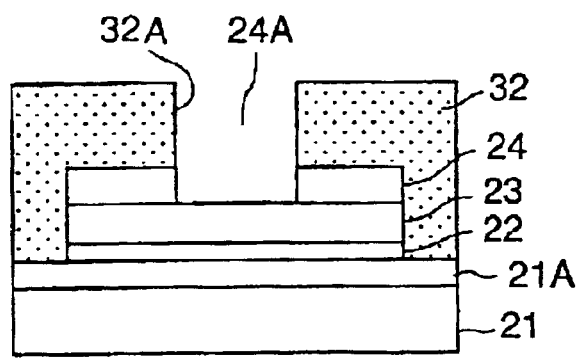

Next, in the step of FIG. 5B, the resist pattern 31 of FIG. 5A is removed and a next resist pattern 32 having a resist opening 32A in correspondence to a gate recess region of the HEMT 20 to be formed is provided on the structure thus obtained. By applying a patterning process to the InGaAs layer 24 while using the resist pattern 32 as a mask, the opening 24A is formed in the InGaAs layer 24. As a result of formation of the opening 24A, the InGaAs layer 24 is divided into the contact regions 24B and 24C.

Figure 5C:
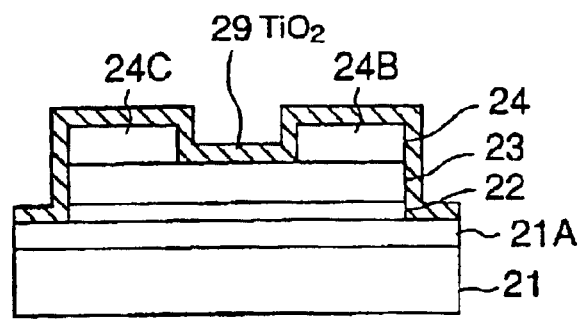

Next, in the step of FIG. 5C, the resist pattern 32 is removed and a Ti film is deposited on the structure thus obtained by an evaporation deposition process, such that the Ti film covers the surface of the device region 20A including the side wall of the device region 23 and further the surface of the buffer layer 21A exposed by the device isolation grooves 20B and 20C, uniformly with a thickness of about 4 nm.

In the step of FIG. 5C, the Ti film thus formed is further converted to a $TiO_2$ film 29 by applying thereto an oxygen plasma process. It should be noted that the oxidation process of the Ti film to form the $TiO_2$ film 29 is conducted so as to obtain an effective insulating film, even in such a case the "$TiO_2$" film thus formed has actually a non-stoichiometric composition $TiO_x$. In the description hereinafter, the film 29 is designated as $TiO_2$ even in such a case the film 29 has such a non-stoichiometric composition $TiO_x$.

Figure 5D:
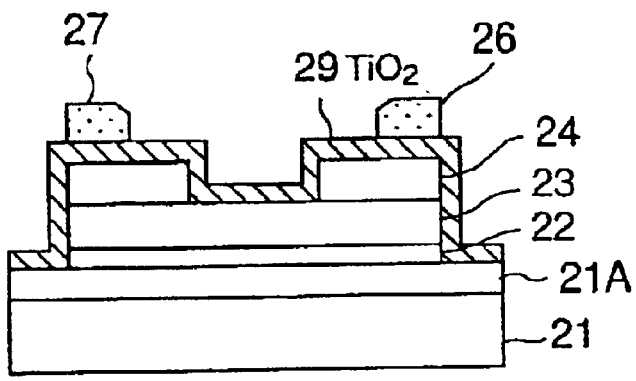

Next, in the step of FIG. 5D, a resist pattern (not shown) having openings in correspondence to the ohmic electrodes 26 and 27 is formed on the $TiO_2$ film 29, and a conductive layer is formed on the resist pattern thus formed so as to include the foregoing resist openings, by consecutively depositing a Ti layer, a Pt layer and an Au layer with respective thicknesses of 1 nm, 30 nm and 200 nm. By lifting off the resist pattern and the Ti/Pt/Au layer thus deposited thereon, the ohmic electrodes 26 and 27 are formed. It should be noted that the ohmic electrodes 26 and 27 can achieve an effective ohmic contact with the corresponding contact regions 24B and 24C due to the extremely small thickness of about 4 nm of the $TiO_2$ film 29, which thickness being chosen so as to allow efficient tunneling of electrons.

Figure 5E:
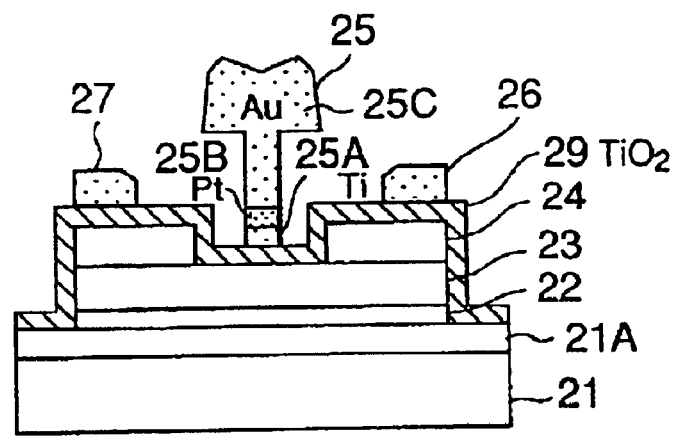

Next, in the step of FIG. 5E, a resist pattern (not shown) having an opening exposing the $TiO_2$ film 29 in correspondence to the gate recess region 24A is formed, and a Ti layer, a Pt layer and an Au layer are deposited consecutively thereon with respective thicknesses of 1 nm, 10 nm and 200 nm. By lifting off the resist pattern and the Ti/Pt/Au layer thereon, the gate electrode 25 described before is obtained.

Figure 1:
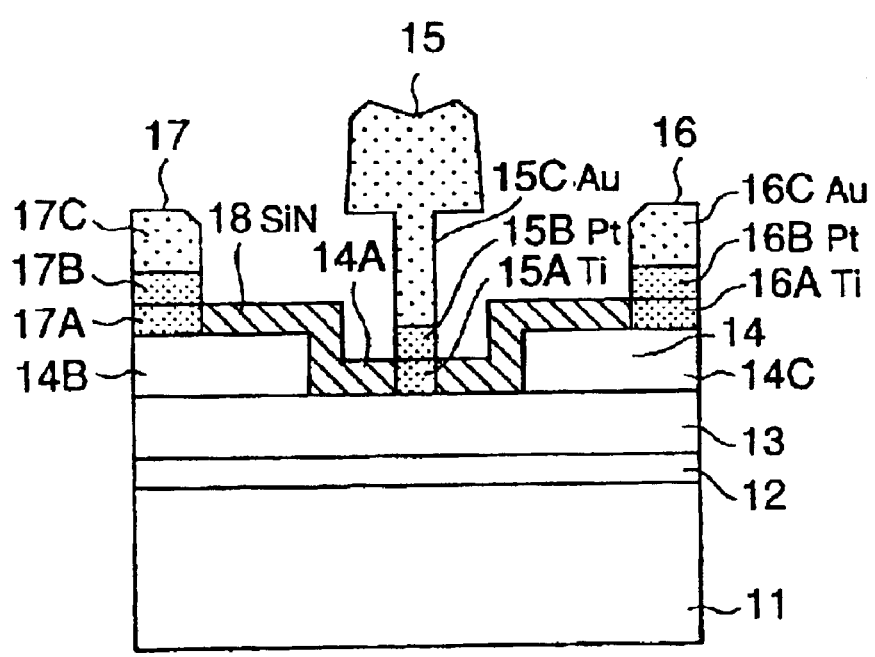
FIG. 1 is a diagram showing the construction of a HEMT according to a related art.
Figure 2:
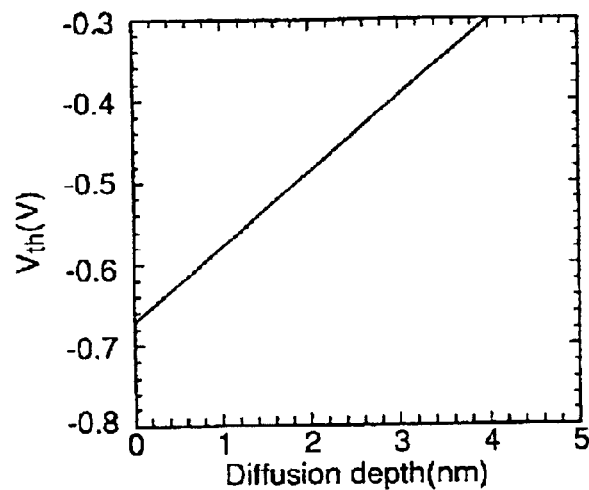
FIG. 2 is a diagram showing the relationship between the threshold characteristic and metal diffusion for the HEMT of FIG. 1.
Figure 3:
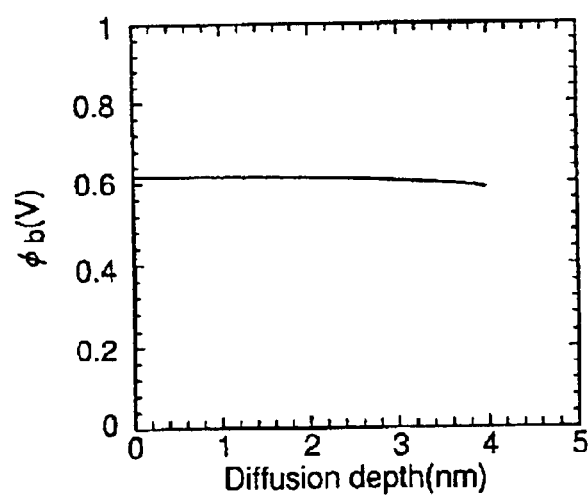
FIG. 3 is a diagram showing the relationship between the Schottky barrier height and metal diffusion for a conventional Schottky diode.
Figure 6:
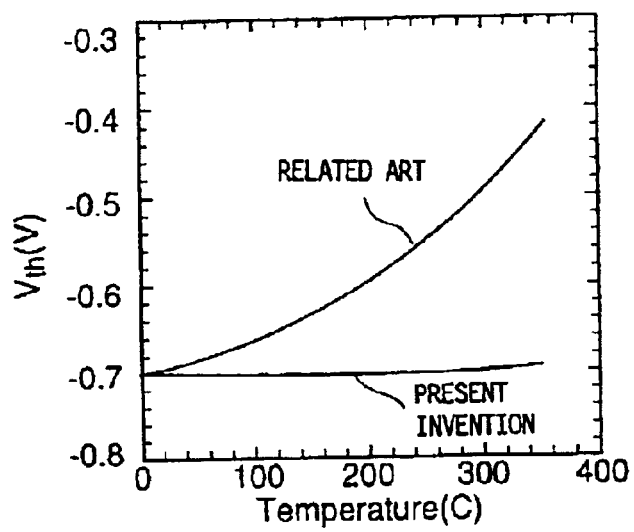
FIG. 6 is a diagram showing the relationship between the threshold characteristic and annealing temperature for the HEMT of FIG. 4 in comparison with a conventional HEMT.

FIG. 6 shows the change of the threshold voltage Vth of the HEMT 40 for the case a thermal annealing process is applied at various temperatures in comparison with the threshold voltage Vth of the HEMT 10 of FIG. 1. Further, FIG. 7 shows the change of the ohmic contact resistance Rc observed fro the HEMT 40 for the case a thermal annealing process is applied at various temperatures in comparison with the ohmic contact resistance Rc of the HEMT 10 of FIG. 1.

Referring to FIG. 6, it can be seen that the threshold voltage Vth of the HEMT 40 does not change at all as long as the temperature of the thermal annealing process Is conducted in the range of 100–300° C., while a substantial change is observed for the threshold voltage of the HEMT 10 with the thermal annealing process of the same temperature range.

Figure 7:
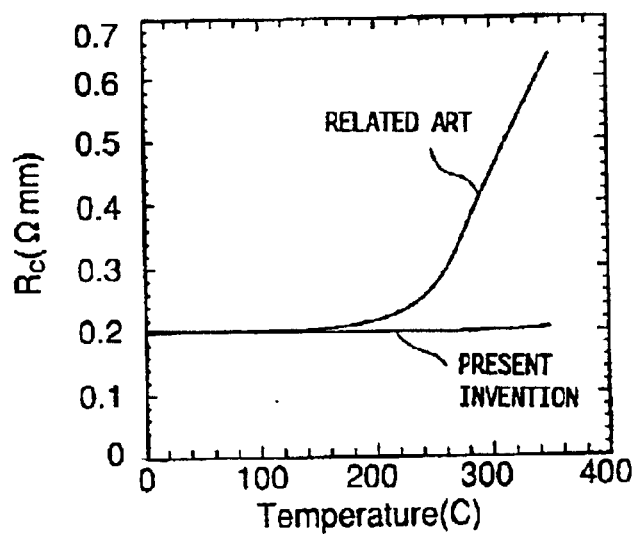
FIG. 7 is a diagram showing the relationship between the ohmic contact resistance and annealing temperature for the HEMT of FIG. 4 in comparison with a conventional HEMT.

Similarly, it can be seen from FIG. 7 that the ohmic contact resistance Rc of the HEMT 40 does not change at all with the thermal annealing process conducted in the range of 100–300° C., while a substantial change is observed for f the HEMT 10 with the thermal annealing process of the same temperature range.

The result of FIGS. 6 and 7 clearly indicate that the thin oxide film 29 provided in the HEMT 40 prevents the diffusion of the Ti atoms from the electrode layer 25A into the channel layer 25.

In the present embodiment, it should be noted that the process of converting the Ti film into the $TiO_2$ film is by no means limited to the oxygen plasma treatment process but may be conducted by a thermal annealing process in an oxidizing atmosphere, or alternatively in the air. In such a case, a heat treatment at a temperature of 150° C. is sufficient for causing the desired conversion.

[Second Embodiment]

Next, a fabrication process of a HEMT 50 according to a second embodiment of the present invention will be described with reference to FIGS. 8A–8D, wherein those parts corresponding to the parts described previously are designated by the same reference numerals and the description thereof will be omitted.

Figure 8A:
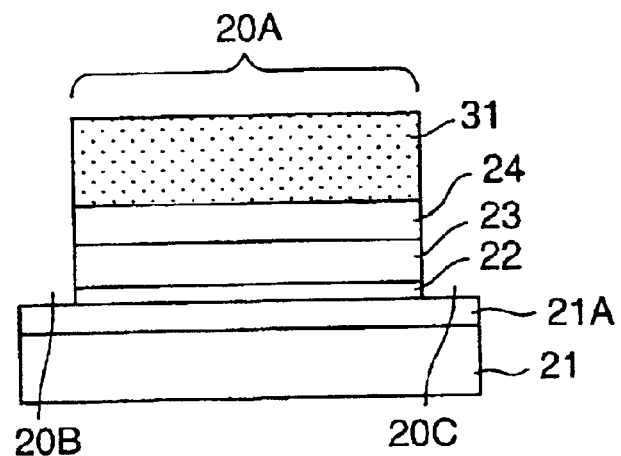
FIGS. 8A–8F are diagrams showing the fabrication process of a HEMT according to a second embodiment of the present invention.

Referring to FIG. 8A, the process is substantially identical with the process of FIG. 5A and a layered semiconductor structure for the device region 20A is formed by stacking the semiconductor layers 22–24 consecutively and patterning the same while using the resist pattern 31 as a mask.

Figure 8B:
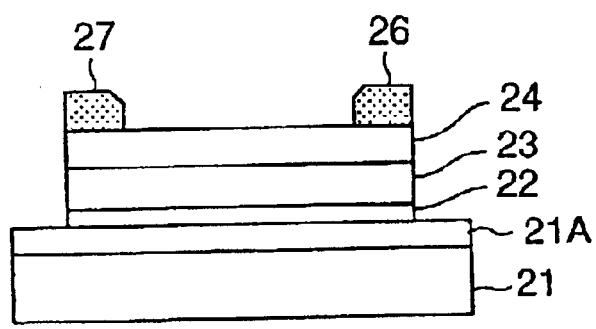

Next, in the step of FIG. 8B, the resist pattern 31 of FIG. 8A is removed and ohmic electrodes 26 and 27 are formed on the InGaAs cap layer 24 directly.

Figure 8C:
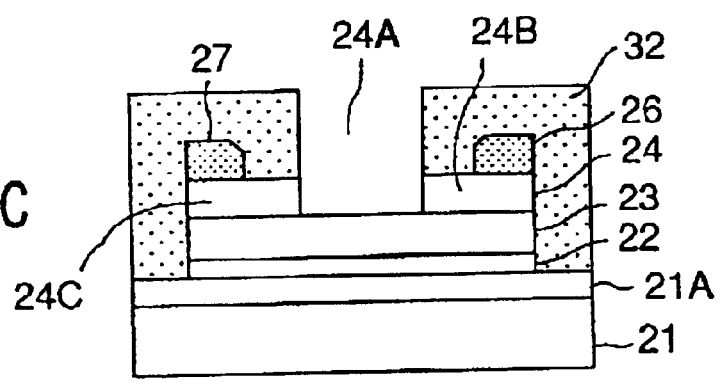

Next, in the step of FIG. 8C, the resist pattern 32 is provided on the structure of FIG. 8B so as to cover the ohmic electrodes 26 and 27, and the InGaAs cap layer 24 is patterned while using the resist pattern 32 as a mask, to form the gate recess 24A in the layer 24 in correspondence to the resist opening in the resist pattern 32. As a result of the formation of the gate recess 24A, the InGaAs cap layer 24 is divided into the contact regions 24B and 24C.

Figure 8D:
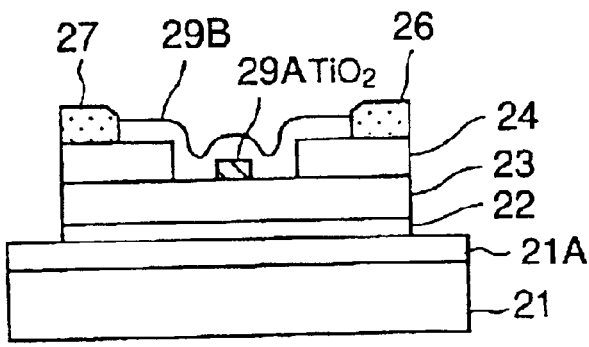

Next, the resist pattern 32 is removed in the step of FIG. 8D and a Ti film is deposited on the exposed surface of the electron-supplying layer 23 by an evaporation deposition process. Further, the Ti film is subjected to a patterning process while using a resist pattern (not shown) such that the Ti film is remained on the part on which the gate electrode is to be formed. Further, a SiN passivation film 29B is deposited on the structure thus obtained so as to cover the Ti pattern.

Figure 8E:
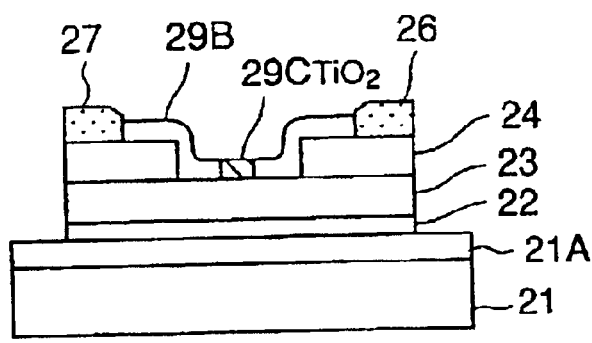

Next, the SiN passivation film 29B is subjected to a patterning process in the step of FIG. 8E while using a resist pattern (not shown) as a mask such that the Ti pattern 29A is exposed, and the Ti pattern 29A thus exposed is converted to a $TiO_2$ pattern 29C by applying thereto an oxygen plasma process. In this case, too, the oxidation process of the Ti film to form the $TiO_2$ pattern 29C may be conducted such that the $TiO_2$ pattern 29C may have a non-stoichiometric composition $TiO_x$. It should be noted that there remains no remnant of the original Ti pattern 29A after the oxidation process, and the $TiO_2$ pattern 29C thus obtained forms an insulating pattern.

Figure 8F:
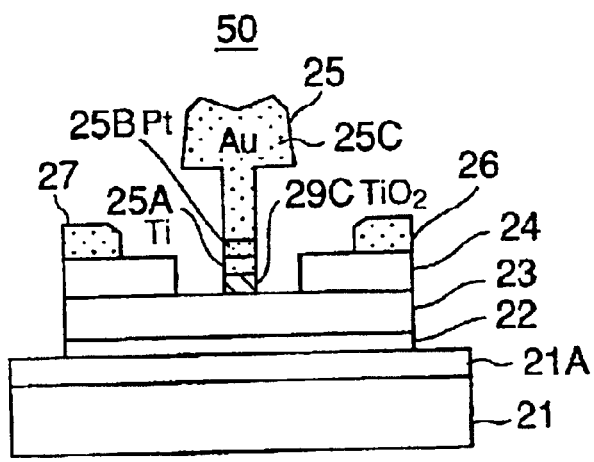

Next, in the step of FIG. 8F, a resist pattern (not shown) having openings exposing the $TiO_2$ pattern 29C is formed, and the gate electrode 25 having the foregoing Ti/Pt/Au layered structure is formed by a lift-off process using such a resist pattern.

In the HEMT 50 thus formed, the variation of the threshold characteristic as a result of thermal annealing process is effectively suppressed similarly to the case of the HEMT 30 of the previous embodiment.

[Third Embodiment]

Figure 9A:
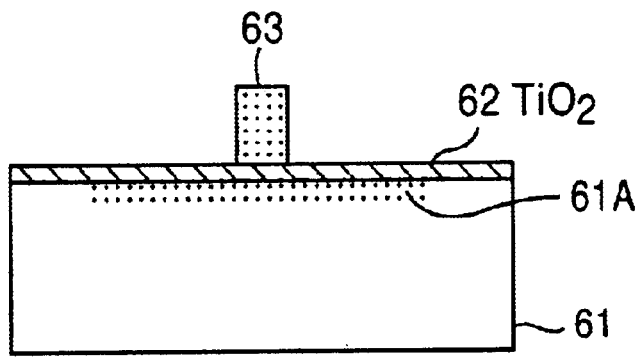
FIGS. 9A–9C are diagrams showing the fabrication process of a MESFET according to a third embodiment of the present invention.
Figure 9B:
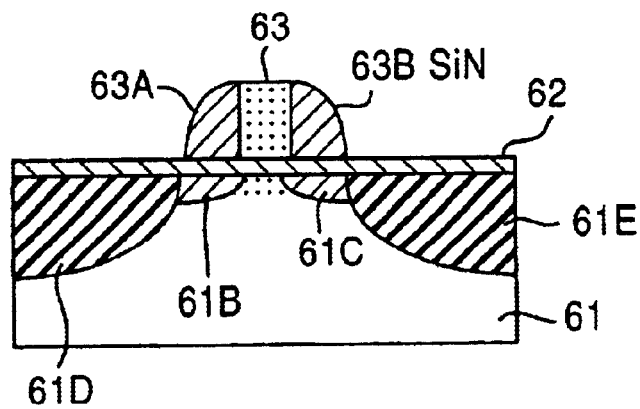
Figure 9C:
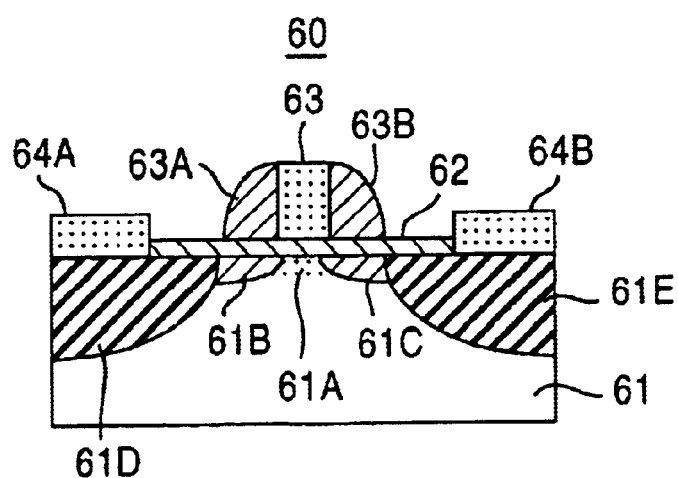

FIGS. 9A–9C are diagrams showing the fabrication process of a MESFET 60 according to a third embodiment of the present invention.

Referring to FIG. 9A, a semi-insulating GaAs substrate 61 is subjected to an ion implantation process of Si and there is formed an n-type channel region 61A on the surface of the substrate 61 after a rapid thermal annealing process for causing a diffusion of the Si atoms thus induced. Typically, the ion implantation process may be conducted under the acceleration voltage of 30 keV with a dose of $2 \times 10^{12}$ cm$^{-2}$.

The thermal annealing process may be conducted in an $N_2$ atmosphere at 800° C. for 30 seconds.

In the step of FIG. 9A, it should be noted that a $TiO_2$ film 62 is formed on the substrate 61 so as to cover the channel region 61A with a uniform thickness of about 4 nm. Such a $TiO_2$ film 62 may be formed by depositing a Ti film uniformly with a thickness of about 4 nm by an evaporation deposition process, followed by an oxygen plasma treatment process for converting the Ti into $TiO_2$ film. It is not necessary that the $TiO_2$ film thus obtained has a stoichiometric composition but may be have a non-stoichiometric composition represented as $TiO_x$, as long as there remains no Ti remnant in the $TiO_2$ film 62 after the oxygen plasma treatment process. As a result of such a plasma treatment process, the $TiO_2$ film 62 thus obtained becomes an excellent insulating film.

In the structure of FIG. 9A, a gate electrode 63 of WSi is formed on the $TiO_2$ film 62 with a thickness or height of about 300 nm.

Next, in the next step of FIG. 9B, an ion implantation process of $Si^+$ is conducted into the GaAs substrate 61 while using the gate electrode 63 as a self-alignment mask, and $n^-$-type LDD regions 61B and 61C are formed in the substrate 61 at both lateral sided of the WSi gate electrode 63.

Next, in step of FIG. 9B, and SiN film is deposited on the GaAs substrate 61 by plasma CVD process such that the SiN film covers the WSi gate electrode 63, and side wall insulation films 63A and 63B are formed on both lateral side walls of the gate electrode 63 as a result of anisotropic etching process applied of the SiN film such that the etching proceeds generally perpendicular to the principal surface of the substrate 61.

In the step of FIG. 9B, a further ion implantation process of $Si^+$ is conducted under an acceleration voltage of 50 keV with a dose of $5 \times 10$ cm$^{-2}$ while using WSi gate electrode 63 and the side wall insulation films 63A and 63B as a self-aligned mask, and $n^+$-type diffusion regions 61D and 61E are formed in the GaAs substrate 61 at outer sides of the LDD regions 61B and 61C, respectively.

Finally, contact holes are formed in the $TiO_2$ film 62 so as to expose the diffusion regions 61D and 61E by a resist process, and ohmic electrodes 64A and 64B, each having an AuGe/Au structure, are formed in correspondence to the contact holes.

In the MESFET thus obtained, it should be noted that there occurs no change of threshold voltage even when an alloying process, typically conducted in an $N_2$ atmosphere at 350° C. for 5 minutes, is applied to the ohmic electrodes 64A and 64B, as the diffusion of metal elements from the WSi gate electrode 63 into the GaAs substrate 61 is positively prevented by the $TiO_2$ film 62.

It should be noted that the $TiO_2$ film 29 or $TiO_2$ film 62 of the previous embodiments is by no means limited to an $TiO_2$ film or a $TiO_x$ film but various oxides of metal elements such as Co, Ni, Ta, Pr, Hf, Zr and Pd may be used for the purpose.

Further, the gate electrode formed on the metal oxide film is not limited to the one having the Ti/Pt/Au stacked structure or the one formed of WSi, but may have a Ti/Al stacked structure or a Ti/Mo stacked structure.

Further, the present invention is not limited to the embodiments described heretofore, but various variations and modifications may be made without departing from the scope of the invention.

What is claimed is:

1. A compound semiconductor field effect transistor, comprising:

a compound semiconductor layer including a channel layer and an electron supplying layer;

a gate electrode electrically contacting said compound semiconductor layer to control a current flow in said channel layer, said gate electrode having a multi-layer structure including a Ti layer, a Pt layer and an Au layer; and an intermediate layer including a $TiO_2$ layer, formed between said Ti layer and said compound semiconductor layer, wherein said intermediate layer has a thickness of about 4 nm.

2. A compound semiconductor field effect transistor as claimed in claim 1, wherein said $TiO_2$ layer has a stoichiometric composition.

3. A compound semiconductor field effect transistor as claimed in claim 1, wherein said $TiO_2$ layer has a non-stoichiometric composition.

4. A compound semiconductor field effect transistor as claimed in claim 1, wherein said compound semiconductor device further includes first and second ohmic electrodes in contact with said compound semiconductor layer at both lateral sides of said gate electrode, and wherein $TiO_2$ layer is provided further at an interface between said first ohmic electrode and said compound semiconductor layer and between said second ohmic electrode and said compound semiconductor layer.

5. A compound semiconductor field effect transistor as claimed in claim 4, wherein said $TiO_2$ layer has a thickness allowing tunneling of carriers therethrough.

6. A compound semiconductor field effect transistor as claimed in claim 5 wherein said $TiO_2$ layer is provided so as to cover a surface of said compound semiconductor layer continuously from said first ohmic electrode to said gate electrode and from said gate electrode to said second ohmic electrode.

7. A semiconductor triode as claimed in claim 1, wherein said channel layer includes a two-dimensional electron gas.

8. The compound semiconductor field effect transistor as claimed in claim 1, wherein said compound semiconductor layer comprises an InGaAs layer acting as said channel layer and an electron-supplying layer of InAlAs formed on said channel layer, and wherein said intermediate layer is formed between said Ti layer and said InAlAs layer.

9. The compound semiconductor transistor as claimed in claim 8, wherein said multi-layer structure comprises a layered structured in which a Pt layer and an Au layer are stacked on said Ti layer.

10. The compound semiconductor field effect transistor as claimed in claim 1, wherein said $TiO_2$ layer is an insulating layer.

11. The compound semiconductor field effect transistor as claimed in claim 1, wherein said intermediate layer has a thickness of 4 nm.

* * * * *